(12) United States Patent
Wu et al.

(10) Patent No.: US 7,264,913 B2
(45) Date of Patent: Sep. 4, 2007

(54) ANTIREFLECTIVE COMPOSITIONS FOR PHOTORESISTS

(75) Inventors: Hengpeng Wu, Hillsborough, NJ (US);
Shuji Ding-Lee, Branchburg, NJ (US);
Zhong Xiang, Somerset, NJ (US);
Joseph E. Oberlander, Phillipsburg, NJ (US); Mark O. Neisser, Whitehouse Station, NJ (US); Eleazar Gonzalez, Bloomfield, NJ (US); Jainhui Shan, Pennington, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 400 days.

(21) Appl. No.: 10/301,462

(22) Filed: Nov. 21, 2002

(65) Prior Publication Data
US 2004/0101779 A1    May 27, 2004

(51) Int. Cl.
G03C 1/825 (2006.01)
G03C 1/74 (2006.01)
G03F 7/20 (2006.01)
G03F 7/30 (2006.01)
G03F 7/36 (2006.01)

(52) U.S. Cl. ............... 430/270.1; 430/271.1; 430/325; 430/326; 430/908; 430/914; 430/919; 430/921; 430/330

(58) Field of Classification Search ............ 430/270.1, 430/271.1, 908, 914, 919, 921, 325, 326, 430/905
See application file for complete search history.

(56) References Cited

U.S. PATENT DOCUMENTS

| | | | |
|---|---|---|---|
| 2,585,323 A | 2/1952 | Elwell et al. | 528/274 |
| 3,483,169 A | 12/1969 | Case et al. | 527/311 |
| 3,497,472 A | 2/1970 | Driscoll | 528/296 |
| 3,856,752 A | 12/1974 | Bateman et al. | 528/229 |
| 3,919,172 A | 11/1975 | Rhein et al. | 528/280 |
| 4,196,129 A | 4/1980 | Rhein et al. | 549/242 |
| 4,299,942 A * | 11/1981 | Piestert et al. | 526/323.1 |
| 4,491,628 A | 1/1985 | Ito et al. | 430/176 |
| 4,912,160 A | 3/1990 | Shalati | 524/379 |
| 5,069,997 A | 12/1991 | Schwaim et al. | 430/270.1 |
| 5,350,660 A | 9/1994 | Urano et al. | 430/176 |
| 5,395,918 A | 3/1995 | Harris et al. | 528/353 |
| 5,480,964 A | 1/1996 | Harris et al. | 528/353 |
| 5,498,690 A | 3/1996 | Kim et al. | 528/296 |
| 5,585,219 A | 12/1996 | Kaimoto et al. | 430/270.1 |
| 5,596,073 A | 1/1997 | Michael et al. | 528/353 |
| 5,935,760 A | 8/1999 | Shao et al. | 430/271.1 |
| 5,962,621 A | 10/1999 | Beckerdite et al. | 528/176 |
| 6,664,363 B1 | 12/2003 | Faunce | 528/295.5 |
| 6,261,743 B1 | 7/2004 | Pavelchek et al. | 430/325 |
| 2004/0101779 A1 | 5/2004 | Wu et al. | |
| 2005/0234201 A1 | 10/2005 | Wu et al. | 525/437 |

FOREIGN PATENT DOCUMENTS

EP    0 789 278 A2    8/1997

(Continued)

OTHER PUBLICATIONS

Full English translation of JP 59-8770 (provided by PTO).*

(Continued)

*Primary Examiner*—Sin J. Lee
(74) *Attorney, Agent, or Firm*—Sangya Jain

(57) ABSTRACT

The present invention relates to a novel antireflective coating composition comprising a polymer, a crosslinking agent and an acid generator. The present invention further relates to a process for using the novel composition, particularly at 193 nm. The polymer of the present invention contains at least one unit selected from structures 1, 2 and 3,

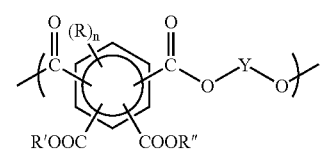

(1)

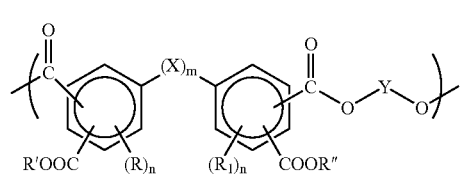

(2)

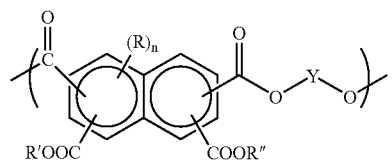

(3)

where, Y is a hydrocarbyl linking group of 1 to about 10 carbon atoms, R, $R_1$, R' and R" are independently hydrogen, hydrocarbyl group of 1 to about 10 carbon atoms, halogen, —O(CO)Z, —C(CF$_3$)$_2$Z, —C(CF$_3$)$_2$(CO)OZ, —SO$_2$CF$_3$, —(CO)OZ, —SO$_3$Z, —COZ, —OZ, —NZ$_2$, —SZ, —SO$_2$Z, —NHCOZ, —NZCOZ or —SO$_2$NZ$_2$, where Z is H or a hydrocarbyl group of 1 to about 10 carbon atoms, n=1–4, X is O, CO, S, COO, CH$_2$O, CH$_2$COO, SO$_2$, NH, NL, OWO, OW, W, and where L and W are independently hydrocarbyl groups of 1 to about 10 carbon atoms, and m=0–3.

31 Claims, No Drawings

FOREIGN PATENT DOCUMENTS

| | | |
|---|---|---|
| EP | 0 794 458 A2 | 9/1997 |
| EP | 0 583 205 B1 | 8/1998 |
| GB | 886601 | 1/1962 |
| GB | 2 320 718 A | 7/1998 |
| JP | 59 008770 | 1/1984 |
| JP | 59-8770 * | 1/1984 |
| JP | 59 088770 | 1/1984 |
| WO | WO97/33198 | 9/1997 |
| WO | WO 00/17712 | 3/2000 |
| WO | WO 00/67072 | 11/2000 |

OTHER PUBLICATIONS

George J. Cernigliaro et al, "Dissolution Rate Modifying Chemistry: Interation of Base-soluble and Base-insoluble Non-actinic Dyes with Novolak Polymers and Novolak-based Positive Photoresists", SPIE vol. 1086, 1989, pp. 106-116.

Jim D. Meador et al, "Recent Progress in 193 nm Antireflective Coatings", SPIE, vol. 3678, pp. 800-809.

PCT/ISA/210 International Search Report Mailed Mar. 19, 2004 3 pages.

Notification of Transmittal of the International Search Report and the Written Opinion of the International Searching Authority, or the Declaration (Form PCT/ISA/220) for PCT/IB/005/00879.

International Search Report (Form PCT/ISA/210) for PCT/IB2005/00879.

Written Opinion of the International Searching Authority (Form PCT/ISA/237) for PCT/IB/005/00879.

Copy of Office Action date mailed Oct. 7, 2005 for U.S. Appl. No. 10/817,987.

PCT/ISA/210 International Search Report Mailed Mar. 19, 2004—3 Pages.

Written Opinion (Form PCT/IPEA/408) for PCT/EP03/12383.

Notification of Transmittal of the International Preliminary Examination Report (Form PCT/IPEA/416) and International Preliminary Examination Report (Form PCT/IPEA/409) for PCT/EP03/12383.

* cited by examiner

ANTIREFLECTIVE COMPOSITIONS FOR PHOTORESISTS

FIELD OF INVENTION

The present invention relates to novel antireflective coating compositions and their use in image processing by forming a thin layer of the novel antireflective coating composition between a reflective substrate and a photoresist coating. Such compositions are particularly useful in the fabrication of semiconductor devices by photolithographic techniques.

BACKGROUND

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

High resolution, chemically amplified, deep ultraviolet (100–300 nm) positive and negative tone photoresists are available for patterning images with less than quarter micron geometries. There are two major deep ultraviolet (uv)exposure technologies that have provided significant advancement in miniaturization, and these are lasers that emit radiation at 248 nm and 193 nm. Examples of such photoresists are given in the following patents and incorporated herein by reference, U.S. Pat. No. 4,491,628, U.S. Pat. No. 5,350,660, EP 794458 and GB 2320718. Photoresists for 248 nm have typically been based on substituted polyhydroxystyrene and its copolymers. On the other hand, photoresists for 193 nm exposure require non-aromatic polymers, since aromatics are opaque at this wavelength. Generally, alicyclic hydrocarbons are incorporated into the polymer to replace the etch resistance lost by not having aromatics present. Furthermore, at lower wavelengths the reflection from the substrate becomes increasingly detrimental to the lithographic performance of the photoresist. Therefore, at these wavelengths antireflective coatings become critical.

The use of highly absorbing antireflective coatings in photolithography is a simpler approach to diminish the problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the resist film as the thickness of the resist changes. Reflective notching becomes severe as the photoresist is patterned over substrates containing topographical features, which scatter light through the photoresist film, leading to line width variations, and in the extreme case, forming regions with complete photoresist loss.

In the past dyed photoresists have been utilized to solve these reflectivity problems. However, it is generally known that dyed resists only reduce reflectivity from the substrate but do not substantially eliminate it. In addition, dyed resists also cause reduction in the lithographic performance of the photoresist, together with possible sublimation of the dye and incompatibility of the dye in resist films.

In cases where further reduction or elimination of line width variation is required, the use of bottom antireflective coating provides the best solution for the elimination of reflectivity. The bottom antireflective coating is applied to the substrate prior to coating with the photoresist and prior to exposure. The resist is exposed imagewise and developed. The antireflective coating in the exposed area is then etched, typically in an oxygen plasma, and the resist pattern is thus transferred to the substrate. The etch rate of the antireflective film should be relatively high in comparison to the photoresist so that the antireflective film is etched without excessive loss of the resist film during the etch process. Inorganic types of antireflective coatings include such films as TiN, TiON, TiW and spin-on organic polymer in the range of 30 nm. Inorganic B.A.R.C.s require precise control of the film thickness, uniformity of film, special deposition equipment, complex adhesion promotion techniques prior to resist coating, separate dry etching pattern transfer step, and dry etching for removal.

Organic B.A.R.C.s are more preferred and have been formulated by adding dyes to a polymer coating (Proc. SPIE, Vol. 1086 (1989), p. 106). Problems of such dye blended coatings include 1) separation of the polymer and dye components during spin coating 2) dye stripping into resist solvents, and 3) thermal diffusion into the resist upon the baking process. All these effects cause degradation of photoresist properties and therefore are not the preferred composition.

Light absorbing, film forming polymers are another option. Polymeric organic antireflective coatings are known in the art as described in EP 583,205, and incorporated herein by reference. However, these polymers have been found to be ineffective when used as antireflective coatings for photoresists sensitive to 193 nm. It is believed that such antireflective polymers are very aromatic in nature and thus are too reflective, acting as a mirror rather than absorbers. Additionally, these polymers being highly aromatic, have too low a dry etch rate, relative to the new type of non-aromatic photoresists used for 193 nm exposure, and are therefore ineffective for imaging and etching. Photoresist patterns may be damaged or may not be transferred exactly to the substrate if the dry etch rate of the antireflective coating is similar to or less than the etch rate of the photoresist coated on top of the antireflective coating.

Therefore, it is necessary to have a bottom antireflective coating that functions well at exposures less than 230 nm. Such antireflective coatings need to have high etch rates and be sufficiently absorbing to act as antireflective coatings. U.S. Pat. No. 5,935,760 describes a bottom antireflective coating based on a very specific crosslinkable polyester polymer.

The novel antireflective coatings of the present invention, comprising a novel polyester polymer based on a unique chemical structure, have been found to have good dry etching properties, which enable a good image transfer from the photoresist to the substrate, and also good absorption characteristics to prevent reflective notching and line width variations or standing waves, particularly at 193 nm. The antireflective coating of the present invention has a relatively high etch rate such that the antireflective coating is removed with minimal loss in the thickness of the photoresist layer. Additionally, substantially no intermixing is present between the antireflective coating and the photoresist film. The antireflective coatings also have good solution stability and form particularly thin films with good coating quality, the latter being particularly advantageous for lithography. When the antireflective coating is used with a photoresist in the imaging process, clean images are obtained with good lithographic properties.

SUMMARY

It is the object of this invention to provide an antireflective coating with superior lithographic performance, where such an antireflective coating composition for a photoresist layer comprises a polymer, a crosslinking agent and an acid or/and acid generator, and where the polymer comprises at least one unit selected from structure 1, 2 and 3,

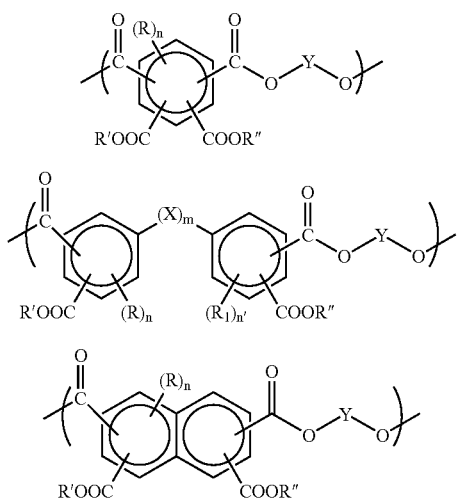

where, Y is a hydrocarbyl linking group of 1 to about 10 carbon atoms, R, $R_1$, R' and R" are independently hydrogen, hydrocarbyl group of 1 to about 10 carbon atoms, halogen, —O(CO)Z, —C(CF$_3$)$_2$Z, —C(CF$_3$)$_2$(CO)OZ, —SO$_2$CF$_3$, —(CO)OZ, —SO$_3$Z, —COZ, —OZ, —NZ$_2$, —SZ, —SO$_2$Z, —NHCOZ, —NZCOZ or —SO$_2$NZ$_2$, where Z is H or a hydrocarbyl group of 1 to about 10 carbon atoms, n=1–4, n'=1–4, X is O, CO, S, COO, CH$_2$O, CH$_2$COO, SO$_2$, NH, NL, OWO, OW, W, and where L and W are independently hydrocarbyl groups of 1 to about 10 carbon atoms, and m=0–3.

The invention further provides for a process for imaging the anti-reflective coating composition of the present invention.

DESCRIPTION OF THE INVENTION

The present invention relates to a novel antireflective coating composition comprising a polymer, a crosslinking agent and an acid generator. The present invention further relates to a process for using the novel composition, particularly at 193 nm. The polymer of the present invention contains at least one unit selected from structures 1, 2 and 3,

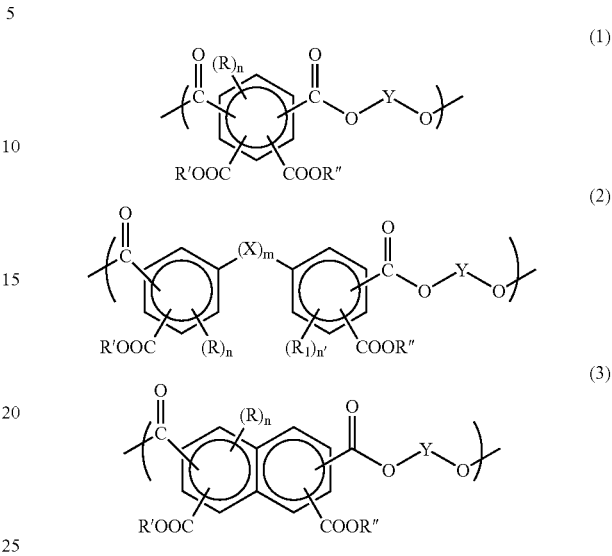

where, through the entire disclosure, Y is a hydrocarbyl linking group of 1 to about 10 carbon atoms, R, $R_1$, R' and R" are independently hydrogen, hydrocarbyl group of 1 to about 10 carbon atoms, halogen, —O(CO)Z, —C(CF$_3$)$_2$Z, —C(CF$_3$)$_2$(CO)OZ, —SO$_2$CF$_3$, —(CO)OZ, —SO$_3$Z, —COZ, —OZ, —NZ$_2$, —SZ, —SO$_2$Z, —NHCOZ, —NZCOZ or —SO$_2$NZ$_2$, where Z is H or a hydrocarbyl group of 1 to about 10 carbon atoms, n=1–4, n'=1–4, X is O, CO, S, COO, CH$_2$O, CH$_2$COO, SO$_2$, NH, NL, OWO, OW, W, and where L and W are independently hydrocarbyl groups of 1 to about 10 carbon atoms, and m=0–3.

As used herein, the term "hydrocarbyl substituent" or "hydrocarbyl group" is used in its ordinary sense, which is well-known to those skilled in the art. Specifically, it refers to a group having a carbon atom directly attached to the molecule and having predominantly hydrocarbon character. Examples of hydrocarbyl groups include:

(1) hydrocarbon groups, that are, aliphatic (e.g., alkyl, alkylenyl or alkenyl), alicyclic (e.g., cycloalkyl, cycloalkenyl), aromatic, aliphatic-, and alicyclic-substituted aromatic substituents, as well as cyclic substituents wherein the ring is completed through another portion of the molecule (e.g., two substituents together form an alicyclic radical);

(2) hydrocarbon groups that contain atoms other than carbon and hydrogen but are predominantly hydrocarbon in nature, where examples of other atoms are sulfur, oxygen or nitrogen, which may be present alone (such as thia or ether) or as functional linkages such as ester, carboxy, carbonyl, etc.;

(3) substituted hydrocarbon groups, that is, substituents containing non-hydrocarbon groups which, in the context of this invention, do not alter the predominantly hydrocarbon substituent (e.g., halo (especially chloro and fluoro), hydroxy, alkoxy, mercapto, alkylmercapto, nitro, nitroso, and sulfoxy);

(4) hetero substituents, that is, substituents which, while having a predominantly hydrocarbon character, in the context of this invention, contain other than carbon in a ring or chain otherwise composed of carbon atoms. Heteroatoms include sulfur, oxygen, nitrogen, and encompass substituents as pyridyl, furyl, thienyl and imidazolyl. In general, no more than two, preferably no more than one, non-hydrocarbon substituent will be present for every ten carbon atoms in the hydrocarbyl group; typically, there will be no non-hydrocarbon substituents in the hydrocarbyl group.

Examples of hydrocarbyl groups are substituted or unsubstituted aliphatic (C1–C10)alkylene group, substituted or unsubstituted thia-alkylene aliphatic (C1–C10) group, substituted or unsubstituted cycloalkylene, substituted or unsubstituted benzyl, alkoxy alkylene, alkoxyaryl, substituted aryl, hetero cycloalkylene, heteroaryl, oxocyclohexyl, cyclic lactone, benzyl, substituted benzyl, hydroxy alkyl, hydroxyalkoxyl, alkoxy alkyl, alkoxyaryl, alkylaryl, alkenyl, substituted aryl, hetero cycloalkyl, heteroaryl, nitroalkyl, haloalkyl, alkylimide, alkyl amide, or mixtures thereof;

More specifically, R, $R_1$, R' and R'' are independently Z, —O(CO)OZ, —C(CF$_3$)$_2$Z, —C(CF$_3$)$_2$(CO)Z, —SO$_2$CF$_3$, —(CO)OZ, —SO$_3$Z, —COZ, —OZ, —NZ$_2$, —SZ, —SO$_2$Z, CN, NO$_2$, —NHCOZ, —NZCOZ or —SO$_2$NZ$_2$, or mixtures thereof, where Z is independently H, or a hydrocarbyl group. More specifically Z is H, halogen or alkyl, cycloalkyl, substituted cycloalkyl, oxocyclohexyl, cyclic lactone, benzyl, substituted benzyl, hydroxy alkyl, hydroxyalkoxyl, alkoxy alkyl, alkoxyaryl, alkylaryl, alkenyl, substituted aryl, hetero cycloalkyl, heteroaryl, nitro, halo, haloalkyl, ammonium, alkyl ammonium, or mixtures thereof. Examples of Z are given here but are not limited to these: —(CH$_2$)$_2$OH, —O(CH$_2$)$_2$O(CH$_2$)OH, —(OCH$_2$CH$_2$)$_k$OH (where k=0–10).

Examples of W are, without limitations, substituted or unsubstituted aliphatic (C1–C10) alkylene, substituted or unsubstituted aliphatic (C1–C10) thia-alkylene, cycloalkylene, substituted cycloalkylene, benzyl, substituted benzyl, hydroxy alkylene, alkoxy alkylene, alkoxyaryl, alkylaryl, alkenyl, substituted aryl, hetero cycloalkylene, heteroaryl, halo alkylene, or mixtures thereof, and L is alkyl, cycloalkyl, substituted cycloalkyl, oxocyclohexyl, cyclic lactone, benzyl, substituted benzyl, hydroxy alkyl, hydroxyalkoxyl, alkoxy alkyl, alkoxyaryl, alkylaryl, alkenyl, substituted aryl, hetero cycloalkyl, heteroaryl, or mixtures thereof.

In the above definitions and throughout the present application, aliphatic refers to a predominantly hydrocarbon chain which is nonaromatic. Substituted or unsubstituted alkylene or thiaalkylene (C1–C10) group means an alkylene or an thiaalkylene group which is predominantly a hydrocarbon chain that may be linear or branched containing up to 10 carbon atoms, and where the substituents are those which do not typically change the hydrocarbon nature of the chain and may be all organic compounds known to those of ordinary skill in the art, such as ether, ester, hydroxyl, alkynol, cyano, nitro, acyl, halogen (chloro or bromo), phenyl and substituted phenyl. Alkyl refers to a hydrocarbon chain containing up to 10 carbon atoms, and may be methyl, ethyl, propyl, isopropyl, butyl, etc. A thiaalkylene group contains one or more sulfur groups in the chain. Examples of aliphatic substituted or unsubstituted alkylene (C1–C10) group which may be linear or branched, are without limitation, methylene, ethylene, propylene, isopropylene, butylenes, isobutylene, pentylene, hexylene, heptylene, octylene, methylhexylene, ethyloctylene, phenylalkylene, nitroalkylene, bromonitroalkylene and substituted phenylalkylene. An example of aliphatic substituted or unsubstituted thia-alkylene (C1–C10) group is without limitation, 3,6-dithia-1,8-octylene. The cycloalkyl groups may be mono or poly cyclic, examples of which are cyclopentyl, cyclohexyl, cycloheptyl, and may further be substituted with the organic groups described above. Aryl refers to substituted or unsubstituted aromatic groups such as phenyl or naphthyl. The aryl group may be part of the polymer backbone or linked to the backbone. Halogen refers to fluorine, chlorine and bromine, although fluorine and chlorine are preferred.

A few embodiments of the polymeric structures may be represented more specifically as 4, 5, 6 and 7:

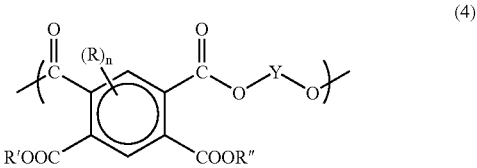

(4)

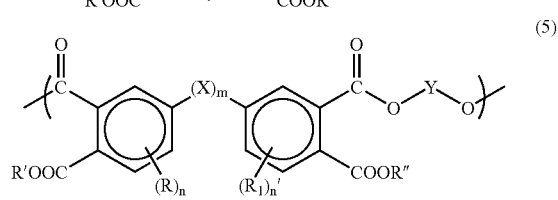

(5)

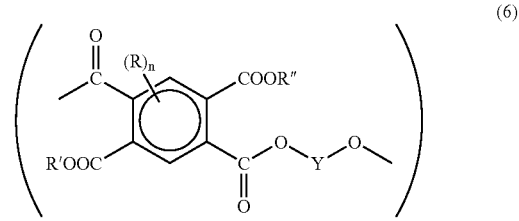

(6)

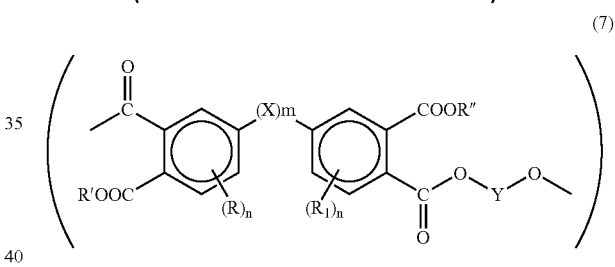

(7)

In one preferred embodiment for the polymer, Y is alkylene, thia-alkylene, aromatic or mixtures thereof; more preferably Y is methylene, ethylene, propylene, —CH$_2$OCH2, —CH$_2$CH$_2$OCH$_2$CH$_2$—, —CH$_2$CH$_2$SCH$_2$CH$_2$—, —CH$_2$CH$_2$SCH$_2$CH$_2$SCH$_2$CH$_2$—, phenylethylene, alkylnitroalkylene, bromonitroalkylene, phenyl and naphthyl.

In another preferred embodiment X is CO or SO$_2$, and Y is alkylene, more preferably Y is methylene, ethylene, propylene, —CH$_2$OCH$_2$, —CH$_2$CH$_2$OCH$_2$CH$_2$—, —CH$_2$CH$_2$SCH$_2$CH$_2$—, —CH$_2$CH$_2$SCH$_2$CH$_2$SCH$_2$CH$_2$—, phenylethylene, alkylnitroalkylene, bromonitroalkylene, phenyl or naphthyl.

The polymers of this invention may be prepared by any of the standard polymerization methods known in the art, examples of such methods are condensation, anionic or cationic copolymerization techniques. The polymer may be synthesized using solution, emulsion, bulk, suspension polymerization, or the like. Typically a dianhydride is condensed with a diol, mostly a nonaromatic diol, at elevated temperatures, and optionally in the presence of an acid, to give a polymer with ester linkages. Various isomers of the polymer may be obtained, where the polymer linkage is either in the meta or para position. The polymer may be reacted further to modify the substituents in the polymer. The resulting carboxylic acid substituent on the phenyl ring may be in the free acid form, may be reacted to give an ester, or be attached to another polymer chain, or be mixtures of these or other substituents.

Some of the monomers which may be used to synthesize the polymer of the present invention and which can represent the Y component are, preferably, diols, glycols and oxides, examples of which are, ethylene glycol, diethylene glycol, propylene glycol, propylene oxide, ethylene oxide, butylenes oxide, 1-phenyl-1,2-ethanediol, 2-bromo-2-nitro-1,3-propane diol, 2-methyl-2-nitro-1,3-propanediol, diethyl-bis(hydroxymethyl)malonate, and 3,6-dithia-1,8-octanediol. Examples of aromatic diols are 2,6-bis(hydroxymethyl)-p-cresol and 2,2'-(1,2-phenylenedioxy)-diethanol, 1,4-benzenedimethanol.

The diols are typically condensed with the phenolic component of the polymer of the present invention, which is typically derived from monomers such as aromatic dianhydrides, examples of which are pyromellitic dianhydride, 3,3',4,4'benzophenone-tetracarboxylic dianhydride and naphthalene dianhydride. For the synthesis of polymers of structure 3, the preferred dianhydrides include 2,3,6,7-naphthalenetetracarboxylic acid dianhydride and 1,4,5,8-naphthalenetetracarboxylic acid dianhydride. Typically a linear polyester is first prepared by the reaction of a dianhydride and a diol in a suitable solvent. The polyester is isolated by precipitation into a non-solvent. The polyester may be further modified by reacting the carboxylic acid groups with alcohols, or alkene oxide.

In certain instances it is important to control the etch resistance and absorptivity of the antireflective coating. In order to provide the desired etch rate of the antireflective coating, especially for imaging below 200 nm, the degree of aromaticity in the polymer may be varied. For high etch rates the Y component in the polymer backbone is preferably nonaromatic. It is generally known to those of ordinary skill in the art that aromatics decrease the etch rate. For low etch rates and/or high absorptivity, highly aromatic polymers are desirable, where the Y component may be highly aromatic. However, in some embodiments, particularly for imaging at wavelengths below 200 nm, optimum performance may be obtained by controlling the etch rate and the absorptivity by using an aliphatic monomer for Y or an appropriate mixture of an aliphatic and an aromatic monomer. The aromatic functionality may also be incorporated at other functional points within the polymer.

In order to form a good antireflective coating from the antireflective coating composition, the polymer should be soluble in the solvent of the composition. Additionally the coating should not be soluble in the solvent of the photoresist, which is to be coated in top of the antireflective coating, and further, the anti-reflective coating should also not be soluble in the aqueous developer solution used to develop the photoresist. The optimum structure of the polymer, having all the necessary properties, may be developed using various strategies. One such strategy is where the polymer may contain mixtures of substituents derived from polymerizing a mixture of monomers, particularly for Y, R, $R_1$, R' and R", where the substituents can vary within the same polymer from hydrogen, ethylene alcohol, methyl, crosslinkages with polymer chains, etc. Thus, the polymer is synthesized from various monomers containing different substituents, such as a mixture of diols and dianhydrides. The polymer, once synthesized, may be further reacted with other chemical compounds to give the appropriate functionality. Another strategy is to partially crosslink the polymer to increase the molecular weight. Once the polymer is synthesized the polymer may be reacted further with a compound which comprises a group or groups capable of crosslinking the polymer, or crosslinked using a crosslinking agent. Crosslinking of the polymer may be facilitated by techniques well know to those skilled in the art, for example by heating and/or catalysis. The extent of crosslinking is determined by the desired physical and chemical properties of the polymer. The crosslinked polymer is then formulated into an antireflective coating composition of the present invention.

The weight average molecular weight of the polymer may range from about 1500 to about 180,000, preferably from about 4,000 to about 60,000 and more preferably from about 10,000 to about 30,000. When the weight average molecular weight is below 1,500, then good film forming properties are not obtained for the antireflective coating and when the weight average molecular weight is too high, then properties such as solubility, storage stability and the like may be compromised.

The antireflective coating composition comprises a polymer, a crosslinking agent, an acid or/and an acid generator, and a solvent.

A variety of crosslinking agents can be used in the composition of the present invention. Any suitable crosslinking agents that can crosslink the polymer in the presence of an acid may be used. Examples, without limitation, of such crosslinking agents are resins containing melamines, methylols, glycoluril, benzoguanamine, urea, hydroxy alkyl amides, epoxy and epoxy amine resins, blocked isocyanates, and divinyl monomers. Monomeric melamines like hexamethoxymethyl melamine; glycolurils like tetrakis(methoxymethyl)glycoluril; and aromatic methylols, like 2,6 bishydroxymethyl p-cresol are preferred.

The acid generator of the present invention, preferably a thermal acid generator is a compound which, when heated to temperatures greater than 90° C. and less than 250° C., generates an acid. The acid, in combination with the crosslinker, crosslinks the polymer. The antireflective film after heat treatment becomes insoluble in the solvents used for coating photoresists, and furthermore, is also insoluble in the alkaline developer used to image the photoresist. Preferably, the thermal acid generator is activated at 90° C. and more preferably at above 120° C., and even more preferably at above 150° C. The antireflective film is heated for a sufficient length of time to crosslink the coating. Examples of thermal acid generators are nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid.

Thermal acid generators are preferred over free acids, although free acids may also be used, in the novel antireflective composition, since it is possible that over time the shelf stability of the antireflective solution will be effected by the presence of the acid, if the polymer were to crosslink in solution. Thermal acid generators are only activated when the antireflective film is heated on the substrate. Additionally, mixtures of thermal acids and free acids may be used. Although thermal acid generators are preferred for crosslinking the polymer efficiently, an anti-reflective coating composition comprising the polymer and crosslinking agent may also be used, where heating crosslinks the polymer. Examples of a free acid are, without limitation, strong acids, such as sulfonic acids. Sulfonic acids such as toluene sulfonic acid, triflic acid or mixtures of these are preferred.

The novel composition may further contain a photoacid generator, examples of which without limitation, are onium salts, sulfonate compounds, nitrobenzyl esters, triazines, etc. The preferred photoacid generators are onium salts and sulfonate esters of hydoxyimides, specifically diphenyl iodnium salts, triphenyl sulfonium salts, dialkyl iodonium salts, triakylsulfonium salts, and mixtures thereof.

The amount of the polymer in the present composition can vary from about 95 weight % to about 50 weight %, preferably about 85 weight % to about 70 weight % and more preferably about 80 weight % to about 70 weight %, relative to the solid portion of the composition. The amount of the crosslinker in the present composition can vary from 5 weight % to about 50 weight %, preferably 15 weight % to about 30 weight % relative to the solid portion of the composition. The amount of the acid or acid generator in the present composition can vary from 0.1 weight % to about 5 weight %, preferably 0.5 weight % to about 3 weight % and more preferably 1 weight % to about 2 weight %, relative to the solid portion of the composition.

Typical solvents, used as mixtures or alone, that can be used for the present composition, without limitation, are propylene glycol monomethyl ether acetate (PGMEA), propylene gycol monomethyl ether (PGME), and ethyl lactate (EL), 2-heptanone, cyclopentanone, cyclohexanone, and gamma butyrolactone, but PGME, PGMEA and EL or mixtures thereof are preferred. Solvents with a lower degree of toxicity, good coating and solubility properties are generally preferred.

The antireflective coating composition comprises the copolymer, crosslinker and the acid generator of the instant invention and a suitable solvent or mixtures of solvents. Other components may be added to enhance the performance of the coating, e.g. monomeric dyes, lower alcohols, surface leveling agents, adhesion promoters, antifoaming agents, etc. Other polymers, such as, novolaks, polyhydroxystyrene, polymethylmethacrylate and polyarylates, may be added to the composition, providing the performance is not negatively impacted. Preferably the amount of this polymer is kept below 50 weight % of the total solids of the composition, more preferably 20 weight %, and even more preferably below 10 weight %.

The optical characteristics of the antireflective coating are optimized for the exposure wavelength and other desired lithographic characteristics. As an example the absorption parameter (k) of the novel composition for 193 nm exposure ranges from about 0.1 to about 1.0, preferably from about 0.2 to about 0.75, more preferably from about 0.25 to about 0.65 as measured using ellipsometry. The value of the refractive index (n) ranges from about 1.25 to about 2.0, preferably from about 1.3 to about 1.9, and more preferably from about 1.55 to about 1.85. Due to the good absorption characteristics of this composition at 193 nm, very thin antireflective films of the order of about 40 nm may be used. This is particularly advantageous when using a nonaromatic photoresist, such as those sensitive at 193 nm, where the photoresist films are thin and must act as an etch mask for the antireflective film.

Since the antireflective film is coated on top of the substrate and is further subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The antireflective coating composition is coated on the substrate using techniques well known to those skilled in the art, such as dipping, spin coating or spraying. The film thickness of the antireflective coating ranges from about 20 nm to about 200 nm. The optimum film thickness is determined, as is well known in the art, to be where no standing waves are observed in the photoresist. It has been unexpectedly found that for this novel composition very thin coatings can be used due to the excellent absorption and refractive index properties of the film. The coating is further heated on a hot plate or convection oven for a sufficient length of time to remove any residual solvent and induce crosslinking, and thus insolubilizing the antireflective coating to prevent intermixing between the antireflective coating and the photoresist layer.

Photoresists can be any of the types used in the semiconductor industry, provided the photoactive compound in the photoresist and the antireflective coating absorb at the exposure wavelength used for the imaging process.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Any photoresists sensitive to short wavelengths, between about 180 nm and about 300 nm can be used in the present invention. These photoresists normally comprise polyhydroxystyrene or substituted polyhydroxystyrene derivatives, a photoactive compound, and optionally a solubility inhibitor. The following references exemplify the types of photoresists used and are incorporated herein by reference, U.S. Pat. No. 4,491,628, U.S. Pat. No. 5,069,997 and U.S. Pat.

No. 5,350,660. Particularly preferred for 193 nm and 157 nm exposure are photoresists comprising non-aromatic polymers, a photoacid generator, optionally a solubility inhibitor, and solvent. Photoresists sensitive at 193 nm that are known in the prior art are described in the following references and incorporated herein, EP 794458, WO 97/33198 and U.S. Pat. No. 5,585,219, although any photoresist sensitive at 193 nm may be used on top of the anti-reflective composition of this invention. Fluorinated polymers are known for being transparent at 193 nm and 157 nm. Such polymers when used in a photoresist are disclosed in EP 789,278, WO 00/67072 and WO 00/17712. WO 00/67072 specifically discloses nonaromatic, alicyclic polymers with pendant fluorinated groups.

The process of the instant invention further comprises coating a substrate with the novel antireflective coating and heating on a hotplate or convection oven at a sufficiently high temperature for sufficient length of time to remove the coating solvent, and crosslink the polymer to a sufficient extent so that the coating is not soluble in the coating solution of the photoresist or in the aqueous alkaline developer. An edge bead remover may be applied to clean the edges of the substrate using processes well known in the art. The preferred range of temperature is from about 90° C. to about 250° C. If the temperature is below 90° C. then insufficient loss of solvent or insufficient amount of crosslinking takes place, and at temperatures above 250° C. the composition may become chemically unstable. A film of photoresist is then coated on top of the antireflective coating and baked to substantially remove the photoresist solvent. The photoresist is imagewise exposed and developed in an aqueous developer to remove the treated photoresist. The developer is preferably an aqueous alkaline solution comprising, for example, tetramethyl ammonium hydroxide. An optional heating step can be incorporated into the process prior to development and after exposure.

The process of coating and imaging photoresists is well known to those skilled in the art and is optimized for the specific type of resist used. The patterned substrate can then be dry etched with an etching gas or mixture of gases, in a suitable etch chamber to remove the exposed portions of the antireflective film, with the remaining photoresist acting as an etch mask. Various gases are known in the art for etching organic antireflective coatings, such as $O_2$, Cl2, F2 and CF4.

An intermediate layer may be placed between the antireflective coating and the photoresist to prevent intermixing, and is envisioned as lying within the scope of this invention. The intermediate layer is an inert polymer cast from a solvent, where examples of the polymer are polysulfones and polyimides.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the anti-reflective coating in the Examples below were measured on a J. A. Woollam VASE32 ellipsometer.

The molecular weight of the polymers was measured on a Gel Permeation Chromatograph.

Example 1

1.0 mole of pyromellitic dianhydride was suspended in 300 g of acetonitrile in a 1 L-flask with a condenser and a mechanical stirrer. Then equimolar ethylene glycol was added. Under nitrogen, the mixture was heated to a gentle reflux. After about 30 minutes, a slightly yellow but clear solution was obtained. The reaction was maintained at this temperature for 6 hrs and cooled to room temperature. The white solid formed during the reaction was filtered out and discarded. The clear filtrate was transferred to a 2 L-flask. To this were added 300 g of ethylene carbonate and 5 g of benzyltriethylammonium chloride. The mixture was heated to 120° C. and maintained for 16 hours. When the reaction was completed, the reaction solution was cooled to room temperature and slowly poured into large amount of water in a high speed blender. The polymer was collected and washed thoroughly with water. Finally the polymer was dried in a vacuum oven.

50 g of polyester prepared using the method described above was dissolved in a mixture of 150 g of methanol and 150 g of ethyl lactate in a 1 L-flask. 5 g of concentrated sulfuric acid was added as catalyst. The solution was heated to a gentle reflux. The reaction was maintained for 22 hours. After cooling to room temperature, the solution was slowly poured into large amount of water in a high speed blender. The white polymer obtained was collected by filtration and washed thoroughly with water. Finally, the polymer was dried in a vacuum oven for 1 day and an overall yield of about 50% was obtained. The polymer obtained had a weight average molecular weight of about 8200 and a polydispersity of 2.8.

An antireflective coating composition was prepared by dissolving 2.4 g of the above polymer, 0.72 g of tetrakis (methoxymethyl)glycoluril, 0.048 g triethylammonium salt of 10-camphorsulfonic acid in 47.6 g ethyl lactate. The solution was filtered through a 0.2 μm filter.

The performance of the anti-reflective coating formulation was evaluated using AZ® EXP AX1020P photoresist (available from AZ Electronic Materials, Clariant Corporation, Branchburg, N.J.). A 106 nm antireflective film from the above solution was coated on a silicon wafer and baked at 200° C. for 60 seconds. The anti-reflective film was found to have (n) value of 1.51 and a (k) value of 0.32. Using AZ® EXP AX1020P photoresist a 330 nm film was coated and baked at 115° C. for 60 seconds. The wafer was then imagewise exposed using an ISI 193 nm ministepper with 0.6NA, 0.7 sigma, under conventional illumination with binary mask. The exposed wafer was baked at 110° C. for 60 seconds and developed using a 2.38 weight % aqueous solution of tetramethyl ammonium hydroxide for 60 seconds. At an exposure dose of 16 mJ/cm2, the line and space patterns at 0.13 micron were observed under scanning electron microscope and showed no standing waves indicating the efficacy of the bottom anti-reflective coating.

Example 2

1.0 mole of pyromellitic dianhydride was suspended in 300 g of acetonitrile in a 1 L-flask with a condenser and a mechanical stirrer. Then equimolar ethylene glycol was added. Under nitrogen, the mixture was heated to a gentle reflux. The reaction was continued for 24 hrs. After cooling the reaction mixture to room temperature, stirring was continued for a few additional hours. The white precipitate formed during the reaction was collected by suction and washed thoroughly with acetonitrile. The solid was dried in a vacuum oven for 1 day.

150 g of the polymer obtained from above and catalytic amount of benzyltriethylammonium chloride were dispersed in 600 g of ethylene carbonate in a 2 L flask. Under nitrogen and mechanical stirring, the mixture was heated to 120° C. The reaction was maintained for about 16 hrs. Then the temperature was raised to 140° C. and the reaction was terminated when a clear solution was obtained. The reaction solution was cooled and filtered. The filtrate was slowly poured into large amount of water under stirring. The white polymer was collected by filtration and washed thoroughly with water, followed by drying in a vacuum oven.

150 g of polyester polymer prepared using the method described above was dissolved in a mixture of 450 g of methanol and 450 g of ethyl lactate in a 2 L-flask. Catalytic amount of concentrated sulfuric acid was added. The solution was heated to a gentle reflux. The reaction was maintained for 22~24 hours. After cooling to room temperature, the solution was slowly poured into a large amount of water in a high speed blender. The white polymer obtained was collected by filtration and washed thoroughly with water. Finally, the polymer was dried in a vacuum oven for 1 day. The overall yield was about 50%. The polymer obtained had a weight average molecular weight of about 7300 and a polydispersity of 2.7.

An antireflective coating composition was prepared by dissolving 2.4 g of the above polymer, 0.72 g of tetrakis (methoxymethyl)glycoluril, 0.048 g triethylammonium salt of 10-camphorsulfonic acid in 47.6 g ethyl lactate. The solution was filtered through 0.2 μm filter.

The performance of the anti-reflective coating formulation was evaluated using AZ® EXP AX1020P photoresist (available from AZ Electronic Materials, Clariant Corporation, Somerville, N.J.). A 106 nm antireflective film from the above solution was coated on a silicon wafer and baked at 200° C. for 60 seconds. The anti-reflective film was found to have (n) value of 1.51 and (k) value of 0.32. Using AZ® EXP AX1020P photoresist a 330 nm film was coated and baked at 115° C. for 60 seconds. The wafer was then imagewise exposed using an ISI 193 nm ministepper with 0.6 NA, 0.7 sigma, under conventional illumination with binary mask. The exposed wafer was baked at 110° C. for 60 seconds and developed using a 2.38 weight % aqueous solution of tetramethyl ammonium hydroxide for 60 seconds. At an exposure dose of 16 mJ/cm2, the line and space patterns at 0.13 micron where observed under scanning electron microscope and showed no standing waves indicating the efficacy of the bottom anti-reflective coating.

Example 3

1.0 mole of pyromellitic dianhydride was suspended in 300 g of acetonitrile in a 1 L-flask with a condenser and a mechanical stirrer. Then equimolar ethylene glycol was added. Under nitrogen, the mixture was heated to a gentle reflux. The reaction was continued for 24 hours. After cooling the reaction mixture to room temperature, stirring was continued for a few hrs. The white precipitate formed during the reaction was collected by suction and washed thoroughly with acetonitrile. The solid was dried in a vacuum oven for 1 day. 300 g of propylene oxide and 300 g of acetonitrile were charged into a 2 L flask with a magnetic bar and a condenser. To this were added 52 g of the solid prepared from above and 2.5 g of benzyltriethylammonioum chloride. Under nitrogen, the reaction mixture was heated to a gentle reflux. The reaction was maintained for 20 hours. After cooling to room temperature, the reaction solution was poured slowly into a large amount of water while stirring. The polymer was collected by suction and washed thoroughly with water and finally dried in vacuum oven for 1 day. The overall yield was about 70%. The polymer obtained had a weight average molecular weight of about 7000 and a polydispersity of 2.1.

An antireflective coating composition was prepared by dissolving 2.4 g of the above polymer, 0.72 g of tetrakis (methoxymethyl)glycoluril, 0.048 g of triethylammonium salt of 10-camphorsulfonic acid in 47.6 g ethyl lactate. The solution was filtered through 0.2 μm filter.

The performance of the anti-reflective coating formulation was evaluated using AZ® EXP AX1020P photoresist (available from AZ Electronic Materials, Clariant Corporation, Branchburg, N.J.). A 106 nm antireflective film from the above solution was coated on a silicon wafer and baked at 200° C. for 60 seconds. The anti-reflective film was found to have (n) value of 1.50 and (k) value of 0.28. Using AZ® EXP AX1020P photoresist a 330 nm film was coated and baked at 115° C. for 60 seconds. The wafer was then imagewise exposed using an ISI 193 nm ministepper with 0.6 NA, 0.7 sigma, under conventional illumination with binary mask. The exposed wafer was baked at 110° C. for 60 seconds and developed using a 2.38 weight % aqueous solution of tetramethyl ammonium hydroxide for 60 seconds. At an exposure dose of 16 mJ/cm2, the line and space patterns at 0.13 micron were observed under scanning electron microscope and showed no standing waves indicating the efficacy of the bottom anti-reflective coating.

Example 4

1.0 mole of pyromelltic dianhydride was dissolved in 600 g of ethylene carbonate in a 1 L-flask with a mechanical stirrer. Then equimolar ethylene glycol was added. Under nitrogen, the reaction mixture was heated to 120° C. The reaction was continued for 7 hrs. Then 10 g of benzyltriethylammonium chloride was added and the reaction was continued for another 16 hrs at the same temperature. The reaction solution was cooled and filtered. The filtrate was slowly poured into a large amount of water while stirring. The white polymer was collected by filtration and washed thoroughly with water, followed by drying in a vacuum oven. 250 g of the polyester polymer prepared using the method described above was dissolved in a mixture of 750 g of methanol and 750 g of ethyl lactate in a flask. 20 g of concentrated sulfuric acid was added as catalyst. The solution was heated to a gentle reflux. The reaction was maintained for 22~24 hours. After cooling to room temperature, the solution was slowly poured into a large amount of water in a high speed blender. The white polymer obtained was collected by filtration and washed thoroughly with water. Finally, the polymer was dried in a vacuum oven for 1 day. The overall yield was about 50%. The polymer obtained had a weight average molecular weight of 6700 and a polydispersity of 3.0.

An antireflective coating composition was prepared by dissolving 2.4 g of the above polymer, 0.72 g of tetrakis (methoxymethyl)glycoluril, 0.048 g triethylammonium salt of 10-camphorsulfonic acid in 47.6 g ethyl lactate. The solution was filtered through 0.2 μm filter.

The performance of the anti-reflective coating formulation was evaluated using AZ® EXP AX1020P photoresist (available from AZ Electronic Materials, Clariant Corporation, Somerville, N.J.). A 106 nm antireflective film from the above solution was coated on a silicon wafer and baked at 200° C. for 60 seconds. The anti-reflective film was found to have (n) value of 1.51 and (k) value of 0.32. Using AZ® EXP AX1020P photoresist a 330 nm film was coated and baked at 115° C. for 60 seconds. The wafer was then imagewise exposed using an ISI 193 nm ministepper with 0.6 NA, 0.7 sigma, under conventional illumination with binary mask. The exposed wafer was baked at 110° C. for 60 seconds and developed using a 2.38 weight % aqueous solution of tetramethyl ammonium hydroxide for 60 seconds. At an exposure dose of 16 mJ/cm2, the line and space patterns at 0.13 micron were observed under scanning electron microscope and showed no standing waves indicating the efficacy of the bottom anti-reflective coating.

Example 5

300 g of ethylene carbonate were warmed to liquid in a 1 L flask with a mechanical stirrer. To this was added 0.31 mole of pyromellitic dianhydride, 0.031 mole of 1-phenyl-1,2-ethanediol and 0.086 mole of 2-bromo-2-nitro-1,3-propanediol. The mixture was heated to 80° C. under nitrogen. The reaction was maintained at this temperature for 23 hours. Then 4.0 g of benzyltriethylammonium chloride was added and the temperature was raised to 110° C. The reaction was maintained at this temperature for 7 hrs. After cooling to room temperature, the reaction solution was slowly poured into large amount of water while stirring. The precipitated polymer was collected, washed thoroughly with water and finally dried in a vacuum oven.

50 g of polyester prepared using the method described above was dissolved in a mixture of 150 g of methanol and 150 g of ethyl lactate in a 1 L-flask. 5 g of concentrated sulfuric acid was added as catalyst. The solution was heated to a gentle reflux. The reaction was maintained for 22~24 hours. After cooling to room temperature, the solution was slowly poured into large amount of water in a high speed blender. The white polymer obtained was collected by filtration and washed thoroughly with water. Finally, the polymer was dried in a vacuum oven for 1 day. The overall yield was about 50%. The polymer obtained had a weight average molecular weight of 6500 and a polydispersity of 2.7.

An antireflective coating composition was prepared by dissolving 2.4 g of the above polymer, 0.72 g of tetrakis (methoxymethyl)glycoluril, 0.048 g triethylammonium salt of 10-camphorsulfonic acid in 47.6 g ethyl lactate. The solution was filtered through 0.2 μm filter.

The performance of the anti-reflective coating formulation was evaluated using AZ® EXP AX1020P photoresist (available from AZ Electronic Materials, Clariant Corporation, Branchburg, N.J.). An antireflective coating film from the above solution was coated on a silicon wafer and baked at 200° C. for 60 seconds. The anti-reflective film was found to have (n) value of 1.74 and a (k) value of 0.33. Then a 330 nm thick AZ® EXP AX1020P photoresist was coated and baked at 115° C. for 60 seconds. The wafer was then imagewise exposed using a 193 nm exposure tool. The exposed wafer was baked at 110° C. for 60 seconds and developed using a 2.38 weight % aqueous solution of tetramethyl ammonium hydroxide for 60 seconds. The line and space patterns when observed under scanning electron microscope showed no standing waves indicating the efficacy of the bottom anti-reflective coating.

Example 6

500 g of ethylene carbonate were warmed until liquid in a 1L flask with a mechanical stirrer. To this were added 0.44 moles of pyromellitic dianhydride and 0.44 moles of 2-bromo-2-nitro-1,3-propanediol. The mixture was heated to 80° C. under nitrogen. The reaction was maintained at this temperature for 7 hours. Then 5 g of benzyltriethylammonium chloride were added and the temperature was raised to 110° C. The reaction was maintained at this temperature for 16 hrs and at 120° C. for another 5 hours. After cooling to room temperature, the reaction solution was slowly poured into a large amount of water while stirring. The precipitated polymer was collected, washed thoroughly with water and finally dried in a vacuum oven. The overall yield was about 50%. The polymer obtained had a weight average molecular weight of about 6500 and a polydispersity of 3.1.

An antireflective coating composition was prepared by dissolving 2.4 g of the above polymer, 0.72 g of tetrakis (methoxymethyl)glycoluril, 0.048 g triethylammonium salt of 10-camphorsulfonic acid in 47.6 g ethyl lactate. The solution was filtered through 0.2 μm filter.

The performance of the anti-reflective coating formulation was evaluated using AZ® EXP AX1020P photoresist (available from AZ Electronic Materials, Clariant Corporation, Somerville, N.J.). A 90 nm antireflective coating film from the above solution was coated on a silicon wafer and baked at 200° C. for 60 seconds. The antireflective film was found to have (n) value of 1.69 and (k) value of 0.29. Using AZ® EXP AX1020P photoresist a 330 nm film was coated and baked at 115° C. for 60 seconds. The wafer was then imagewise exposed using an ISI 193 nm ministepper with 0.6 NA, 0.7 sigma, under conventional illumination with binary mask. The exposed wafer was baked at 110° C. for 60 seconds and developed using a 2.38 weight % aqueous solution of tetramethyl ammonium hydroxide for 60 seconds. At an exposure dose of 16 mJ/cm2, the line and space patterns at 0.13 micron were observed under scanning electron microscope and showed no standing waves indicating the efficacy of the bottom anti-reflective coating.

Example 7

400 g of ethylene carbonate were warmed until liquid in a 1L flask with a mechanical stirrer. To this was added 0.50 moles of pyromellitic dianhydride, 0.50 moles of 2-methyl-2-nitro-1,3-propanediol. Under nitrogen, the mixture was heated to 80° C. The reaction was maintained at this temperature for 23 hours. After 5.0 g of benzyltriethylammonium chloride was added, the temperature was raised to 130° C. and maintained for 4 hours. After cooling to room temperature, the reaction solution was slowly poured into a large amount of water while stirring. The precipitated polymer was collected, washed thoroughly with water and finally dried in a vacuum oven.

40.5 g of the polymer from above was dissolved in a mixture of 122 g of methanol and 20 g of benzyl alcohol in a 1 L-flask. 5 g of 00 concentrated sulfuric acid was added as catalyst. The solution was heated to a gentle reflux. The reaction was maintained for 22 hours. After cooling to room temperature, the solution was slowly poured into a large amount of water in a high speed blender. The white polymer obtained was collected by filtration and washed thoroughly with water. Finally, the polymer was dried in a vacuum oven for 1 day. The overall yield was about 50%. The polymer obtained had a weight average molecular weight of about 6300 and a polydispersity of 3.4.

An antireflective coating composition was prepared by dissolving 2.4 g of the above polymer, 0.72 g of tetrakis (methoxymethyl)glycoluril, 0.048 g triethylammonium salt of 10-camphorsulfonic acid in 47.6 g ethyl lactate. The solution was filtered through 0.2 μm filter.

The performance of the anti-reflective coating formulation was evaluated using AZ® EXP AX1020P photoresist (available from AZ Electronic Materials, Clariant Corporation, Somerville, N.J.). A 106 nm antireflective film from the above solution was coated on a silicon wafer and baked at 200° C. for 60 seconds. The anti-reflective film was found to have (n) value of 1.52 and (k) value of 0.33. Using AZ® EXP AX1020P photoresist a 330 nm film was coated and baked at 115° C. for 60 seconds. The wafer was then imagewise exposed using a 193 nm exposure tool. The wafer was then imagewise exposed using an ISI 193 nm ministepper with 0.6 NA, 0.7 sigma, under conventional illumination with binary mask. The exposed wafer was baked at 110° C. for 60 seconds and developed using a 2.38 weight % aqueous solution of tetramethyl ammonium hydroxide for 60 seconds. At an exposure dose of 16 mJ/cm2, the line and space patterns at 0.13 micron where observed under scanning electron microscope and showed no standing waves indicating the efficacy of the bottom anti-reflective coating.

Example 8

450 g of ethylene carbonate were warmed to liquid in a 1 L flask with a mechanical stirrer. To this was added 0.72 moles of pyromellitic dianhydride, 0.61 moles of 2-methyl-2-nitro-1,3-propanediol, 0.11 moles of 1-phenyl-1,2-ethanediol and 8 g of benzyltriethylammonium chloride. Under nitrogen, the mixture was heated to 80° C. The reaction was maintained at this temperature for 8 hours. After cooling to room temperature, the reaction solution was slowly poured into large amount of water under stirring. The precipitated polymer was collected, washed thoroughly with water and finally dried in a vacuum oven. The polymer was reprecipitated from acetone/water one more time. The overall yield was about 50%. The polymer obtained had a weight average molecular weight of 7000 and a polydispersity of 2.7.

An antireflective coating composition was prepared by dissolving 2.4 g of the above polymer, 0.72 g of tetrakis (methoxymethyl)glycoluril, 0.048 g triethylammonium salt of 10-camphorsulfonic acid in 47.6 g ethyl lactate. The solution was filtered through 0.2 μm filter.

The performance of the anti-reflective coating formulation was evaluated using AZ® EXP AX1020P photoresist (available from AZ Electronic Materials, Clariant Corporation, Somerville, N.J.). An antireflective film from the above solution was coated on a silicon wafer and baked at 200° C. for 60 seconds. The antireflective film was found to have (n) value of 1.66 and (k) value of 0.36. Using AZ® EXP AX1020P photoresist a 330 nm film was coated and baked at 115° C. for 60 seconds. The wafer was then imagewise exposed using a 193 nm exposure tool. The exposed wafer was baked at 110° C. for 60 seconds and developed using a 2.38 weight % aqueous solution of tetramethyl ammonium hydroxide for 60 seconds. The line and space patterns when observed under scanning electron microscope showed no standing waves indicating the efficacy of the bottom anti-reflective coating.

Example 9

0.2 moles of 3,3',4,4'-benzophenone-tetracarboxylic dianhydride and 0.2 moles of 3,6-dithia-1,8-octanenediol were suspended in 250 g of acetonitrile in a 1 L-flask with a condenser and a mechanical stirrer. Under nitrogen, the mixture was heated to a gentle reflux. The reaction was maintained for 24 hours. The polymer precipitated out during the reaction. After the reaction mixture was cooled to room temperature, the polymer was collected by suction. The polymer was redissolved in 300 ml of acetone and reprecipitated from water. The polymer was collected and washed thoroughly with water. Finally the polymer was dried in a vacuum oven. The overall yield for the polymer was about 65%. The polymer obtained had a weight average molecular weight of about 5830 and a polydispersity of 2.2.

An antireflective coating composition was prepared by dissolving 2.4 g of the above polymer, 0.72 g of tetrakis (methoxymethyl), 0.048 g triethylammonium salt of 10-camphorsulfonic acid in 47.6 g ethyl lactate. The solution was filtered through 0.2 μm filter.

The performance of the anti-reflective coating formulation was evaluated using AZ® EXP AX1020P photoresist (available from AZ Electronic Materials, Clariant Corporation, Somerville, N.J.). An antireflective film from the above solution was coated on a silicon wafer and baked at 200° C. for 60 seconds. The antireflective film was found to have (n) value of 1.65 and (k) value of 0.38. Using AZ® EXP AX1020P photoresist a 330 nm film was coated and baked at 115° C. for 60 seconds. The wafer was then imagewise exposed using a 193 nm exposure tool. The exposed wafer was baked at 110° C. for 60 seconds and developed using a 2.38 weight % aqueous solution of tetramethyl ammonium hydroxide for 60 seconds. The line and space patterns when observed under scanning electron microscope showed no standing waves indicating the efficacy of the bottom anti-reflective coating.

What is claimed is:

1. An antireflective coating composition for a photoresist layer comprising a polymer, a crosslinking agent and an acid or/and acid generator, where the polymer comprises at least one unit selected from structure 1, 2 and 3,

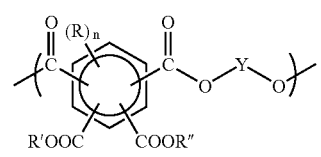

(1)

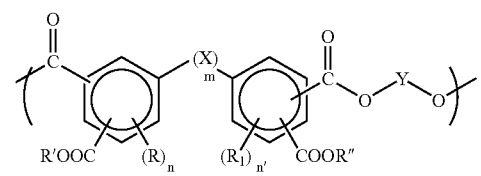

(2)

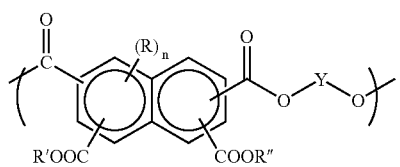

(3)

where, Y is a hydrocarbyl linking group of 1 to about 10 carbon atoms, R, $R_1$, are independently hydrogen, hydrocarbyl group of 1 to about 10 carbon atoms, halogen, —O(CO)Z, —C(CF$_3$)$_2$Z, —C(CF$_3$)$_2$(CO)OZ, —SO$_2$CF$_3$, —(CO)OW, —SO$_3$Z, —COZ, —OZ, —NZ$_2$, —SZ, —SO$_2$Z, —NHCOZ, —NZCOZ or —SO$_2$NZ$_2$, R' and R" are independently a hydrocarbyl group of 1 to about 10 carbon atoms, halogen, —O(CO)Z, —C(CF$_3$)$_2$Z, —C(CF$_3$)$_2$(CO)OZ, —SO$_2$CF$_3$, —SO$_3$Z, —COZ, —OZ, —NZ$_2$, —SZ, —SO$_2$Z, —NHCOZ, —NZCOZ or —SO$_2$NZ$_2$, where Z is H or a hydrocarbyl group of 1 to about 10 carbon atoms, n=1–4, n'=1–4, X is O, CO, S, COO, CH$_2$O, CH$_2$COO, SO$_2$, NH, NL, OWO, OW, or W, and where L and W are independently hydrocarbyl groups of 1 to about 10 carbon atoms, and m=0–3.

2. The composition of claim 1, where the hydrocarbyl is selected from substituted or unsubstituted aliphatic (C1–C10)alkylene group, substituted or unsubstituted thiaalkylene aliphatic (C1–C10) group, substituted or unsubstituted cycloalkylene, substituted or unsubstituted benzyl, alkoxy alkylene, alkoxyaryl, substituted aryl, hetero cycloalkylene, heteroaryl, oxocyclohexyl, cyclic lactone, benzyl, substituted benzyl, hydroxy alkyl, hydroxyalkoxyl, alkoxy alkyl, alkoxyaryl, alkylaryl, alkenyl, substituted aryl, hetero cycloalkyl, heteroaryl, nitroalkyl, haloalkyl, alkylimide, alkyl amide and mixtures thereof.

3. The composition of claim 1 where Y is selected from methylene, ethylene, propylene, butylene, phenylethylene, alkylnitroalkylene, dithiaoctylene, bromonitroalkylene, phenyl, naphthyl, derivatives of phenyl, and derivatives of naphthyl.

4. The composition of claim 3 where Y is selected from 1-phenyl-1,2-ethylene, 2-bromo-2-nitro-1,3-propylene, 2-methyl-2-nitro-1,3-propylene, 3,6-dithia-1,8-octylene, —CH$_2$OCH2, —CH$_2$CH$_2$OCH$_2$CH$_2$—, —CH$_2$CH$_2$SCH$_2$CH$_2$—, —CH$_2$CH$_2$SCH$_2$CH$_2$SCH$_2$CH$_2$—.

5. The composition of claim 1, where the polymer comprises at least one unit of the structure 4, 5, 6 and 7,

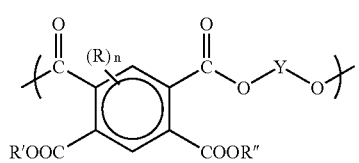

(4)

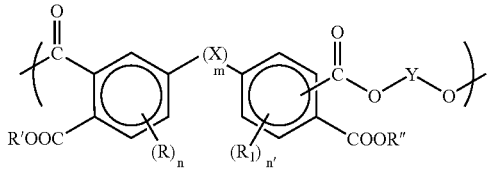

(5)

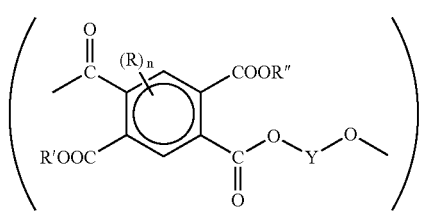

(6)

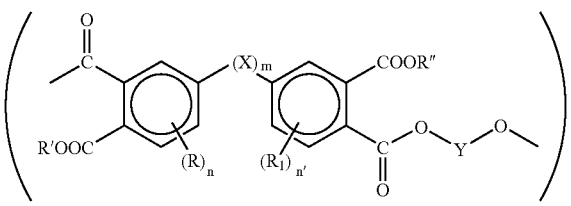

(7)

where, Y is a hydrocarbyl linking group of 1 to about 10 carbon atoms, R, R$_1$, are independently hydrogen, hydrocarbyl group of 1 to about 10 carbon atoms, halogen, —O(CO)Z, —C(CF$_3$)$_2$Z, —C(CF$_3$)$_2$(CO)OZ, —SO$_2$CF$_3$, —(CO)OW, —SO$_3$Z, —COZ, —OZ, —NZ$_2$, —SZ, —SO$_2$Z, —NHCOZ, —NZCOZ or —SO$_2$NZ$_2$, R' and R" are independently a hydrocarbyl group of 1 to about 10 carbon atoms, halogen, —O(CO)Z, —C(CF$_3$)$_2$Z, —C(CF$_3$)$_2$(CO)OZ, —SO$_2$CF$_3$, —SO$_3$Z, —COZ, —OZ, —NZ$_2$, —SZ, —SO$_2$Z, —NHCOZ, —NZCOZ or —SO$_2$NZ$_2$, where Z is H or a hydrocarbyl group of 1 to about 10 carbon atoms, n=1–4, n'=1–4, X is O, CO, S, COO, CH$_2$O, CH$_2$COO, SO$_2$, NH, NL, OWO, OW, or W, and where L and W are independently hydrocarbyl groups of 1 to about 10 carbon atoms, and m=0–3.

6. The composition of claim 1, where the acid generator is a thermal acid generator.

7. The composition of claim 6, where the thermal acid generator is selected from nitrobenzyl tosylates, nitrobenzyl benzenesulfonates, alkyl ammonium salts of organic acids and phenolic sulfonates.

8. The composition of claim 1, where the polymer is partially crosslinked polymer.

9. The composition of claim 8, where the composition further comprises at least one other polymer.

10. The composition of claim 9, where the other polymer is selected from polyhydroxystyrene, novolak, polyarylate and polymethylmethacrylate.

11. The composition of claim 1, where the polymer is a reaction product of at least one diol and at least one dianhydride.

12. The composition of claim 1, where the composition further comprises at least one other polymer.

13. The composition of claim 12, where the other polymer is selected from polyhydroxystyrene, novolak, polyarylate and polymethylmethacrylate.

14. The composition of claim 1, where the acid is a sulfonic acid.

15. An article comprising a substrate with a layer of antireflective coating composition of claim 1 and thereon a coating of photoresist comprising a polymer and a photoactive compound.

16. The composition of claim 1, where the crosslinking agent is selected from melamines, methylols, glycolurils, hydroxy alkyl amides, epoxy and epoxy amine resins, blocked isocyanates, and divinyl monomers.

17. A process for forming an image comprising, a) coating and baking a substrate with the antireflective coating composition comprising a polymer, a crosslinking agent and an acid or/and acid generator, where the polymer comprises at least one unit selected from structure 1, 2 and 3,

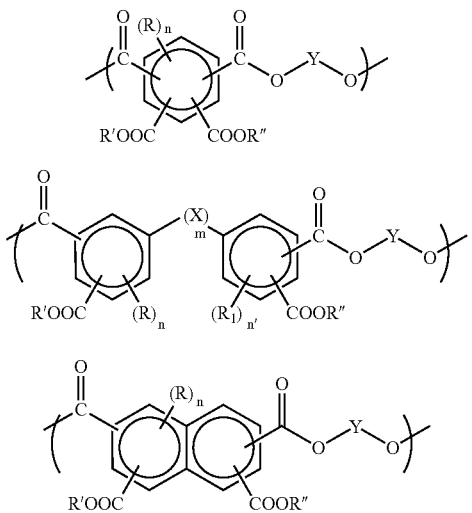

where, Y is a hydrocarbyl linking group of 1 about 10 carbon atoms, $R_1$ $R_1$ R'and R"are independently hydrogen, hydrocarbyl group of 1 to about 10 carbon atoms, halogen, -O(CO)Z, -C(CF$_3$)$_2$Z, -C(CF$_3$)$_2$(CO)OZ, -SO$_2$CF$_3$, -(CO)OZ, -SO$_3$Z, —COZ, -OZ, -NZ$_2$, -SZ, -SO$_2$Z, -NHCOZ, -NZCOZ or -SO$_2$NZ$_2$, where Z is H or a hydrocarbyl group of 1 to about 10 carbon atoms, n=1–4, n'=1–4, X is O, CO, S, COO, CH$_2$O, CH$_2$COO, SO$_2$, NH, NL, OWO, OW, W, and where L and W are independently hydrocarbyl groups of 1 to about 10 carbon atoms, and m=0–3;

b) coating and baking a photoresist film on top of the antireflective coating;
c) imagewise exposing the photoresist;
d) developing an image in the photoresist;
e) optionally, baking the substrate after the exposing step.

18. The process of claim 17, where the photoresist is imagewise exposed at wavelengths between 130 nm to 250 nm.

19. The process of claim 17, where the photoresist comprises a polymer and a photoactive compound.

20. The process of claim 17, where the antireflective coating is baked at temperatures greater than 90° C.

21. The process of claim 17, where the polymer of the antireflective composition is a partially crosslinked polymer.

22. The process of claim 21, where the antireflective composition further comprises at least one other polymer.

23. The process of claim 22, where the other polymer is selected from polyhydroxystyrene, novolak, polyarylate and polymethylmethacrylate.

24. The process of claim 17, where the antireflective composition further comprises at least one other polymer.

25. The process of claim 24, where the other polymer is selected from polyhydroxystyrene, novolak, polyarylate and polymethylmethacrylate.

26. The process of claim 17, where the crosslinking agent is selected from melamines, methylols, glycolurils, hydroxy alkyl amides, epoxy and epoxy amine resins, blocked isocyanates, and divinyl monomers.

27. The process of claim 17, where the acid generator is a thermal acid generator.

28. The process of claim 27, where the thermal acid generator is selected from nitrobenzyl tosylates, nitrobenzyl benzenesulfonates, alkyl ammonium salts of organic acids and phenolic sulfonates.

29. The composition of claim 17, where the hydrocarbyl is selected from substituted or unsubstituted aliphatic (C1-C10)alkylene group, substituted or unsubstituted thia-alkylene aliphatic (C1-C10) group, substituted or unsubstituted cycloalkylene, substituted or unsubstituted benzyl, alkoxy alkylene, alkoxyaryl, substituted aryl, hetero cycloalkylene, heteroaryl, oxocyclohexyl, cyclic lactone, benzyl, substituted benzyl, hydroxy alkyl, hydroxyalkoxyl, alkoxy alkyl, alkoxyaryl, alkylaryl, alkenyl, substituted aryl, hetero cycloalkyl, heteroaryl, nitroalkyl, haloalkyl, alkylimide, alkyl amide and mixtures thereof.

30. The composition of claim 17 where Y is selected from methylene, ethylene, propylene, butylene, phenylethylene, alkylnitroalkylene, dithiaoctylene, bromonitroalkylene, phenyl, naphthyl, derivatives of phenyl, and derivatives of naphthyl.

31. The composition of claim 17 where Y is selected from 1-phenyl-1,2- ethylene, 2-bromo-2-nitro-1,3-propylene, 2-methyl-2-nitro-1,3-propylene, 3,6- dithia-1,8-octylene, -CH$_2$OCH2, -CH$_2$CH$_2$OCH$_2$CH$_2$- , -CH$_2$CH$_2$SCH$_2$CH$_2$-, - CH$_2$CH2SCH$_2$CH$_2$SCH$_2$CH$_2$-.

* * * * *